US009466631B2

(12) United States Patent
Fallica et al.

(10) Patent No.: US 9,466,631 B2
(45) Date of Patent: Oct. 11, 2016

(54) SOLID STATE PHOTOMULTIPLIERS ARRAY OF ENHANCED FILL FACTOR AND SIMPLIFIED PACKAGING

(71) Applicant: STMICROELECTRONICS S.r.l., Agrate Brianza (IT)

(72) Inventors: PieroGiorgio Fallica, Catania (IT); MarioFrancesco Romeo, Fiumefreddo di Sicilia (IT); Domenico Lo Presti, Aci Castello (IT)

(73) Assignee: STMICROELECTRONICS S.R.L., Agrate Brianza (MB) (IT)

( * ) Notice: Subject to any disclaimer, the term of this patent is extended or adjusted under 35 U.S.C. 154(b) by 23 days.

(21) Appl. No.: 14/704,070

(22) Filed: May 5, 2015

(65) Prior Publication Data
US 2015/0333095 A1 Nov. 19, 2015

(30) Foreign Application Priority Data

May 13, 2014 (IT) .............................. MI2014A0865

(51) Int. Cl.
*H01L 27/146* (2006.01)
*H01L 27/144* (2006.01)

(52) U.S. Cl.
CPC ..... *H01L 27/14634* (2013.01); *H01L 27/1446* (2013.01); *H01L 27/14618* (2013.01); *H01L 27/14636* (2013.01); *H01L 27/14643* (2013.01); *H01L 2224/48091* (2013.01); *H01L 2224/48472* (2013.01); *H01L 2224/73265* (2013.01); *H01L 2924/15184* (2013.01); *H01L 2924/181* (2013.01)

(58) Field of Classification Search
CPC .................. H01L 27/14634; H01L 27/14636; H01L 27/14643
USPC ....................................................... 250/208.1
See application file for complete search history.

(56) References Cited

U.S. PATENT DOCUMENTS

| 7,683,459 | B2 | 3/2010 | Ma et al. |
| 7,843,064 | B2 | 11/2010 | Kuo et al. |
| 8,338,219 | B2 * | 12/2012 | Mazzillo ........... H01L 27/14643 257/284 |
| 9,082,675 | B2 * | 7/2015 | Webster ................ H01L 27/144 |

FOREIGN PATENT DOCUMENTS

| GB | 2451447 A | 2/2009 |
| WO | 0013041 A1 | 3/2000 |
| WO | 2005029126 A1 | 3/2005 |

OTHER PUBLICATIONS

"Through-silicon via," Wikipedia, 3 pages.

* cited by examiner

*Primary Examiner* — Seung C Sohn
(74) *Attorney, Agent, or Firm* — Allen, Dyer, Doppelt, Milbrath & Gilchrist, P.A.

(57) ABSTRACT

A multi-pixel photomultiplier optical sensor may include an array of photomultiplier dies. Each photomultiplier die may include a front side connection pad, SPAD cells, each SPAD cell including a front side electrode, a rear side electrode, and a resistor coupled in series to the front side electrode and coupled in common with other quenching resistors to the front side connection pad. The multi-pixel photomultiplier optical sensor may include a metallization layer in contact with the rear side electrode common to SPADs of the array of photomultiplier dies and electrically conductive pads. The electrically conductive bus may be coupled to an electrically conductive pin for distributing bias current to the array of photomultiplier dies. The multi-pixel photomultiplier optical sensor may include electrically conductive bond wires coupling at least some of the electrically conductive pads to the electrically conductive bus, and distributing bias current to the array of photomultiplier dies via the electrically conductive bus.

18 Claims, 8 Drawing Sheets

US 9,466,631 B2

SOLID STATE PHOTOMULTIPLIERS ARRAY OF ENHANCED FILL FACTOR AND SIMPLIFIED PACKAGING

TECHNICAL FIELD

This disclosure relates to architectures and fabrication processes of multi-pixel solid state photomultiplier arrays.

BACKGROUND

Solid state photomultiplier arrays, for example, silicon photomultiplier (SiPM), are being developed because of the many applications in which they are proving to be able to offer unique advantages compared to other types of photo sensors usable for detection of even a relatively limited number of photons. Single photon avalanche diodes (SPAD), also known as Geiger-mode avalanche photodiode, are devices, typically based on a P+PN type junction (or a N+NP+ junction), useful for detection of single photons. The junction has a breakdown voltage VB and is biased, in use, with a reverse bias voltage VA higher in magnitude than the breakdown voltage VB of the junction, typically higher by 10-30%. In this way, the generation of a single electron-hole pair, following absorption of a photon impinging on the SPAD, is sufficient for triggering an ionization process that causes an avalanche of the carriers, with gains of around 106 and consequent generation in short times (hundreds of picoseconds) of an avalanche current that is collected through anode and cathode contacts.

Sensitivity and gain are directly proportional to the value of reverse bias voltage VA applied to the SPAD. In fact, the more the reverse bias voltage VA exceeds, in magnitude, the breakdown voltage VB, the higher the likelihood of an avalanche generation of charge carriers occurring.

However, a high reverse bias voltages VA may favor spurious triggers of an avalanche-ionization process, even in the absence of incident photons (dark conditions), by a single charge carrier that may be generated, for example, by thermal energy exchange, thus producing a so-called dark current. Moreover, a biasing voltage VA appreciably higher than the breakdown voltage VB may, once triggered, render the avalanche-ionization process self-sustaining, thus no longer capable of detecting arrival of successive photons.

Quenching of the avalanche current by lowering the effective voltage Ve across the junction to stop the avalanche-ionization process for a hold-off-time as brief as possible is a way of recovering the ability of detecting arrival of a next photon. A passive type quenching circuit comprises a quenching resistor of few hundred kilo-ohms in series with the junction.

Throughout this disclosure, reference is made to devices realized either on a p-type substrate or on a n-type substrate, for avoiding duplications and simplifying description; however, all the considerations made hold similarly for devices realized on a substrate of the opposite type of conductivity, i.e. inverting all the polarities and symbols in the attached drawings and exchanging expressions such as anode in lieu of cathode and vice versa, in the accompanying description, as will be recognized by the skilled person.

Commonly, a SiPM is a monolithically integrated circuit device of relatively large area and high gain, that basically comprises a dense array of microcells, each defining a SPAD with an associated quenching resistor, capable of supplying, on average, an electrical output signal (current) proportional to the number of photons that impinge on the SiPM. In fact, since the quenching resistors are uncoupled from one another, each photodiode SPAD of the SiPM behaves as an independent binary counter, while the output signal of the SiPM is proportional to the number of activated microcells, i.e. the number of SPADs through which an avalanche ionization process is triggered by a photon, this number being in turn proportional to the number of incident photons.

SUMMARY

Generally speaking, a multi-pixel photomultiplier optical sensor may include an array of photomultiplier dies. Each photomultiplier die may include a front side connection pad, SPAD cells, each SPAD cell including a front side electrode, a rear side electrode, and a resistor coupled in series to the front side electrode and coupled in common with other quenching resistors to the front side connection pad. The multi-pixel photomultiplier optical sensor may include a metallization layer in contact with the rear side electrode common to SPADs of the array of photomultiplier dies and electrically conductive pads. The electrically conductive bus may be coupled to an electrically conductive pin for distributing bias current to the array of photomultiplier dies. The multi-pixel photomultiplier optical sensor may include electrically conductive bond wires coupling at least some of the electrically conductive pads to the electrically conductive bus, and distributing bias current to the array of photomultiplier dies via the electrically conductive bus.

DETAILED DESCRIPTION

Figure 1:
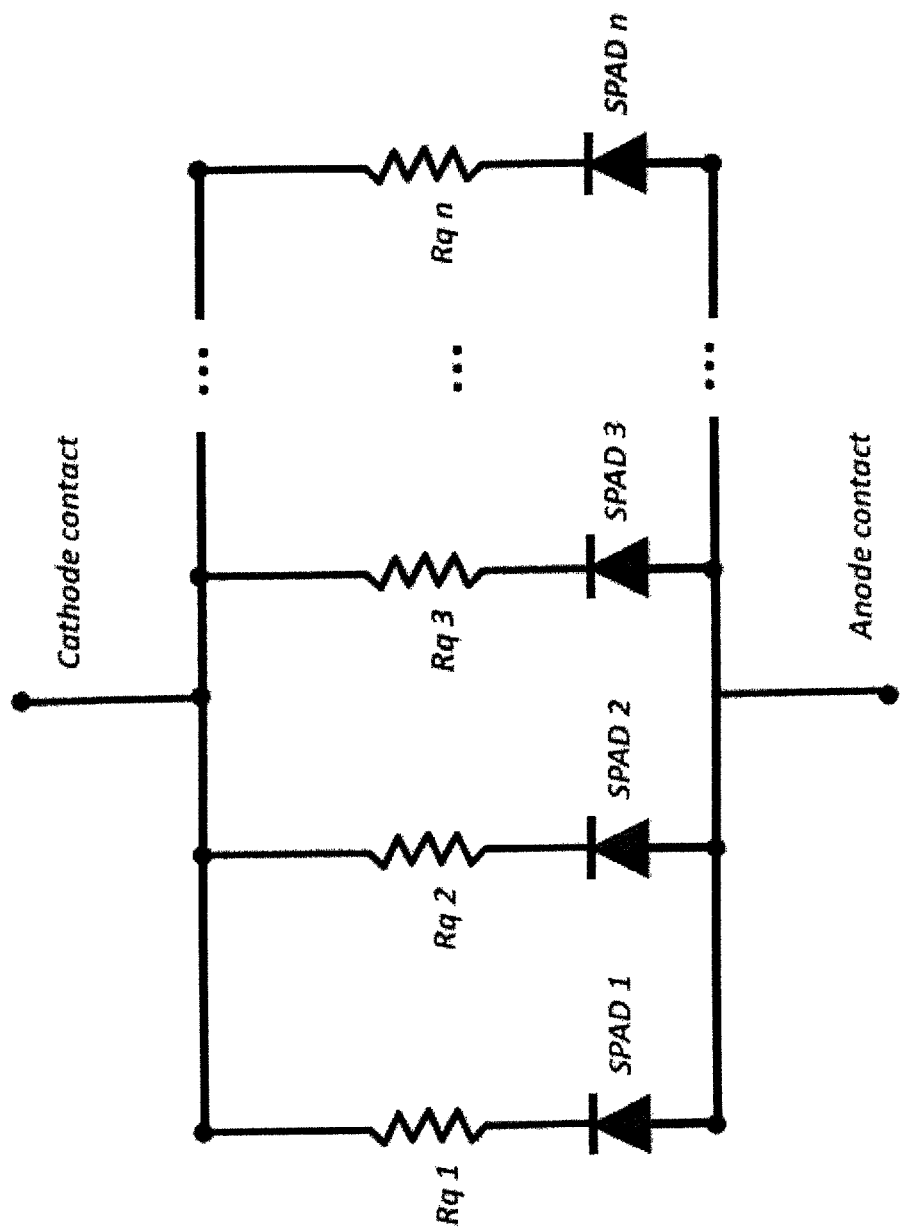
FIGS. 1 to 4 illustrate an electrical scheme and typical integrated structure of a SiPM, and architectures of a multi-pixel array of SiPMs, either monolithically integrated on a single silicon die or in a non-monolithic fashion with individually packaged SiPM devices or with bare dies bonded onto a board, according to the prior art.
Figure 2:
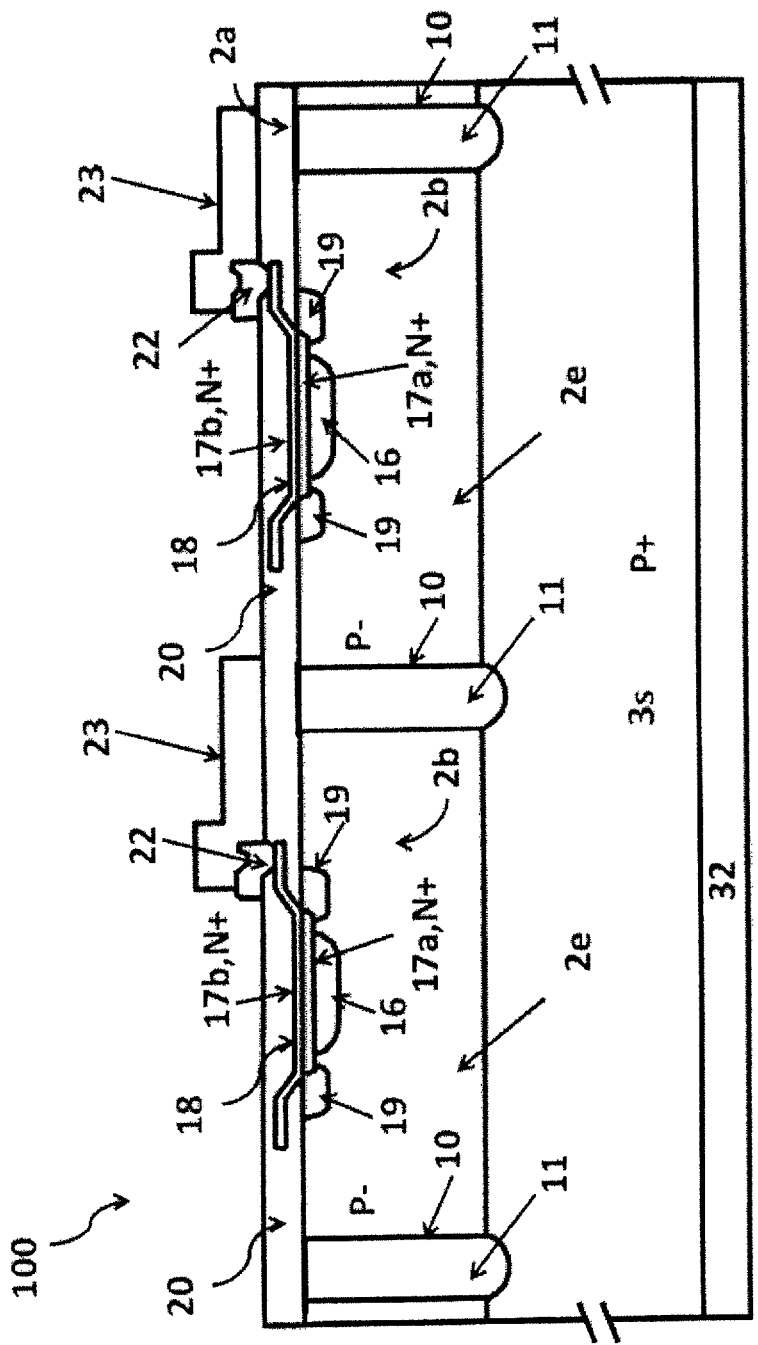

The equivalent electric scheme of a P+PN type junction SiPM fabricated on a P+ doped silicon substrate is shown in FIG. 1. FIG. 2 shows a typical integrated structure of a SiPM 100. Two microcells of the integrated structure are depicted. For the illustrated example, the SiPM chip 100 has a P− type epitaxial layer 2e grown on the P+ type substrate 3s.

A deep trench 10 of square or rectangular perimeter extends vertically for the whole thickness of the epitaxial layer 2e and partially into the substrate 3s delimiting islands 2b of epitaxial layer, each constituting a microcell. The trenches 10 are filled with a metal 11, for example, tungsten to provide optical isolation among the microcells. An implanted P doped enriched region 16, an implanted N+ doped cathode region 17a formed at the top of the enriched region 16, and a N doped guard ring 19, laterally contiguous to and surrounding the N+ cathode region 17a, all generally having a square or rectangular perimeter, are formed in the epitaxial layer 2e. A thick thermal oxide layer 20 grown over the epitaxial layer defines the cathode areas of the microcells.

A N+ doped polycrystalline silicon top cathode layer 17b deposited onto the N+ doped cathode region 17a completes the cathode 18 of the individual SPAD of the microcell. The implanted guard ring region 19, at the surface 2a of the epitaxial layer, forms a PN diode with the epitaxial layer 2e for preventing edge breakdown of the enriched region 16. The topping layer 17b of N+ doped polycrystalline silicon is generally not planar and may have a raised peripheral edge that extends above the guard ring 19, being deposited and defined over a partly grown thermal oxide layer 20.

An electrical contact with the cathode top layer 17b of deposited N+ doped polycrystalline silicon is realized onto its raised portion by defining a deposited layer 22 of N− doped polycrystalline silicon adapted to constitute a resistor of few hundreds of kilo-ohms in series to the photodiode of each microcell for quenching the avalanche current. A metal grid of metal lines 23, commonly comprising aluminum alloy, typically with width of few micrometers, connects all the series resistors of the individual SPADs to a front side connection pad, defined in the same metal layer of definition of the metal lines 23 of the single SiPM chips.

A metal layer 32 deposited on the back surface of the P+ substrate 3s constitutes the common anode contact of all the integrated SPADs of the SiPM chip. A glossary of commonly used abbreviated expressions and acronyms and their meaning is provided herein below.

| Abbreviations/<br>acronyms | Description |
|---|---|
| PET | Positron Emission Tomography |
| SPECT | Single-Photon Emission Computed Tomography |
| SiPM | Silicon Photomultiplier |
| MPPC | synonymous of the acronym "SiPM" |
| SPAD | Single Photon Avalanche Diode |
| Quenching resistor (Rq) | A resistor of high value monolithically integrated near or inside the SPAD and connected in series with it. |
| Microcell (μcell) | A SPAD connected to a quenching resistor. |
| Pixel | In digital imaging, a pixel, or picture element is a physical point in a raster image. The same word is used to mean the smallest addressable element of a display device, or the smallest addressable element in an optical sensor device. The address of a pixel corresponds to its physical coordinates. In case of an optical sensor composed by an array of SiPM devices, the word "pixel" indicates a SiPM of the array. |
| FWHM | Full Width at Half Maximum |
| Sensors Arrays | A matrix of devices arranged in rows and columns |
| Monolithic Sensor Array | An Integrated Circuit on a single (silicon) chip made of arrays of sensor devices |
| Detector | The sensor and the circuitry solution to detect the out signal. |
| Via/Vias | Through hole that allows connection among overlaid layers. |
| TSV | Through Silicon Vias—Vias implemented inside a silicon chip. |
| Silicon Sensor Tile | Array of silicon sensors. |
| Bare Dice | The silicon chip not yet connected by soldering and wiring to a macroscopic package interface. |
| PMT | Photomultipliers Tubes. |
| MR/PET | Magnetic Resonance/PET. |
| PDE | Photon detection efficiency. |

| Abbreviations/<br>acronyms | Description |
|---|---|
| RC delay | Time shift of signals caused by a filtering effect due to resistances and capacitances whether of a circuital component or of parasitic nature. |
| 3D-Integration | Tri-dimensional mechanical structural and functional design in a plane (layout) and a vertical out of plane direction. |
| Optical Package | An electronic device packaging that is optically clear for incident light at least in the visible range (400-850 nm). |
| FR4 | Standard material used for Printed Circuit Board - (Flame Retardant). |
| Bump bonding | A solution for bonding silicon or packaged device to a substrate using solder (lead) paste pre-formed in bump-like shapes. |

An application of solid state photomultipliers is in PET detectors that must provide a measure of energy, arrival time, and position of incident gamma rays. Commercially available detectors typically comprise scintillator crystals that convert gamma rays into optical photons and photomultiplier tubes (PMTs) that convert the optical signals into electrical signals; however, new generation equipment will most likely use detectors made of arrays of optically isolated scintillator crystals, each crystal being coupled to a dedicated photosensor (one-to-one coupling).

The interest in using solid state semiconductor devices is motivated by several key properties. Firstly, being solid state devices, the silicon photomultipliers are compact, robust and compatible with strong magnetic fields, contrarily to the photomultiplier tubes (PMTs), that are commonly used in clinical PET systems. Compatibility with strong magnetic fields should allow, in principle, a combined operation in MR/PET diagnostic systems. Secondly, solid state semiconductor devices, as for example the most commonly studied, SiPMs, share many of the most useful properties of PMTs, i.e. a high signal gain, in the order of 105 to 106, and a relatively short pulse response, in the order of tenths of a nanosecond, with the additional advantages of a higher photon detection efficiency (PDE) and a bias voltage that commonly is less than 100 V.

Lately, SiPM devices with high PDE, in blue wavelength range, have been commercialized. The mentioned performances were obtained by using p-on-n technology (a p-type anode on n-type substrate) and by reducing "blind" spaces among active microcell areas (i.e. enhancing the so-called fill-factor).

Though some applications may use a single SiPM, many important applications specially for monitoring, screening, non-destructive testing, non-invasive diagnostic and alike, require an array, or several arrays of SiPMs. In these contexts, each SiPM in the array is commonly referred to as "pixel" because it produces a picture element. In most equipment of this type, like in PETs, the array of SiPMs should have a ratio as high as possible between active area and total projected area of the array (the so-called "array fill factor").

The active area of an array of SiPMs corresponds to the sum of the active areas in all the SiPMs (pixels of the imaging sensor). Leading SiPM manufacturers today are able to minimize blind areas among the microcells of the integrated SiPM structure. However, there is another important contribution to the blind space due to the distance of separation between adjacent SiPMs of the multi-chip array (i.e. between adjacent pixels of the photo sensor). The problem of reducing blind spaces in large size sensor arrays is still open to significant improvement.

There are many approaches to fabricate SiPM arrays with a high fill factor. The monolithic approach uses many SiPMs in the same piece of silicon (die). The die has at least a front contact (an anode pad or a cathode pad) per each SiPM (pixel); the other contact (coherently a cathode or an anode contact) is the silicon substrate, common to all the microcells of the SiPM. The non-monolithic approach uses silicon dies, each containing one SiPM, are mounted on a substrate (for example, of FR4 or ceramic) having metal routes defined thereon.

Figure 3:
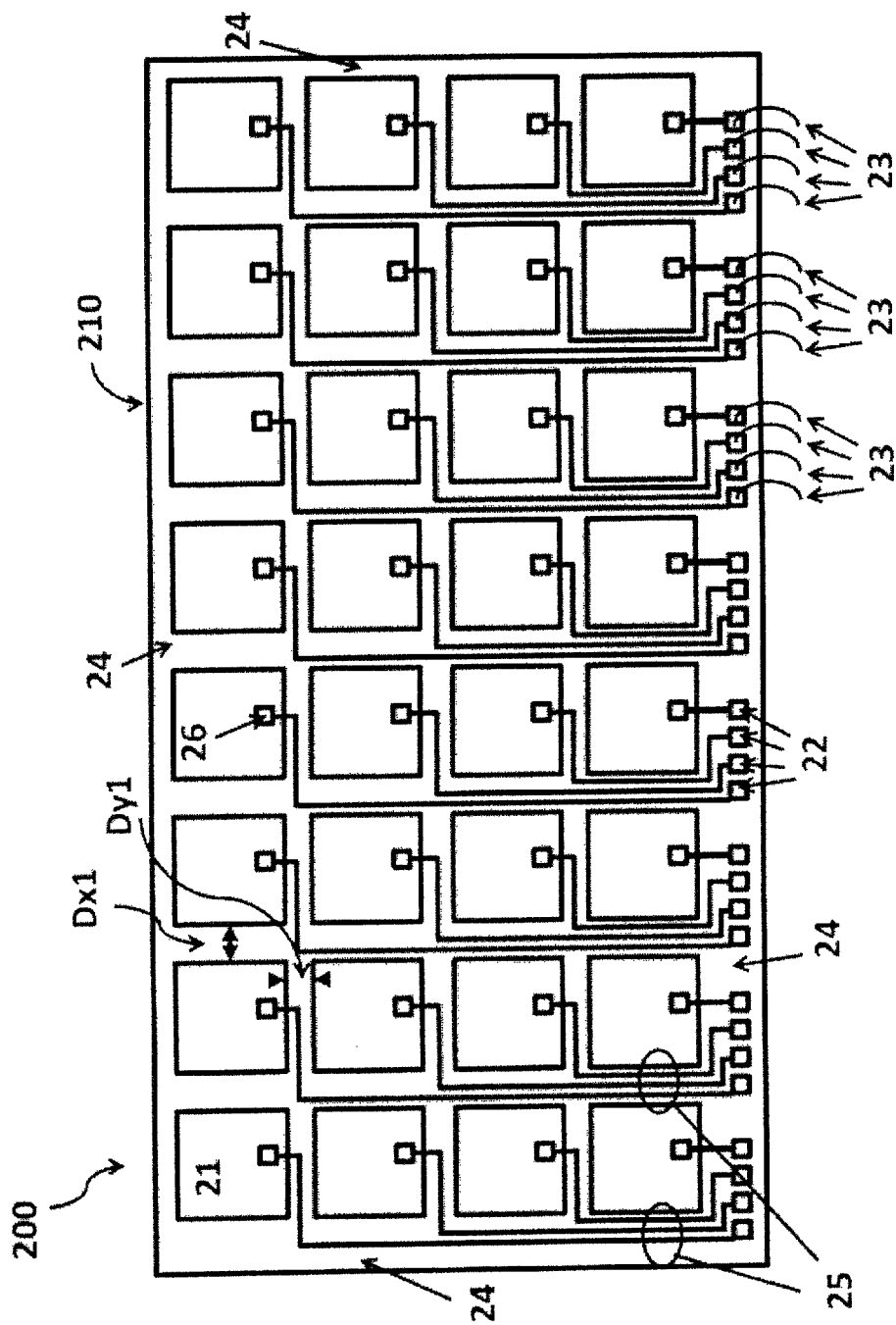

The monolithic SiPM array 200, depicted in FIG. 3, may become problematic as the number of pixels 21 increases. In fact, the pads 22 for the wires 23 must be arranged on the periphery 24 of the die. The metal lines 25 connecting the cathode pad 26 of each pixel to the pads 22 require a non-negligible silicon area (blind areas). An example of a monolithic implementation of a SiPM array on a single chip, is the commercial device S11828-3344M (1.2×1.2 cm) by Hamamatsu Photonics K.K. of Hamamatsu, Japan. Typically, the width of tree-pattern metal lines (blind areas) between columns of pixels rapidly becomes prohibitive as their number increases.

Figure 4:
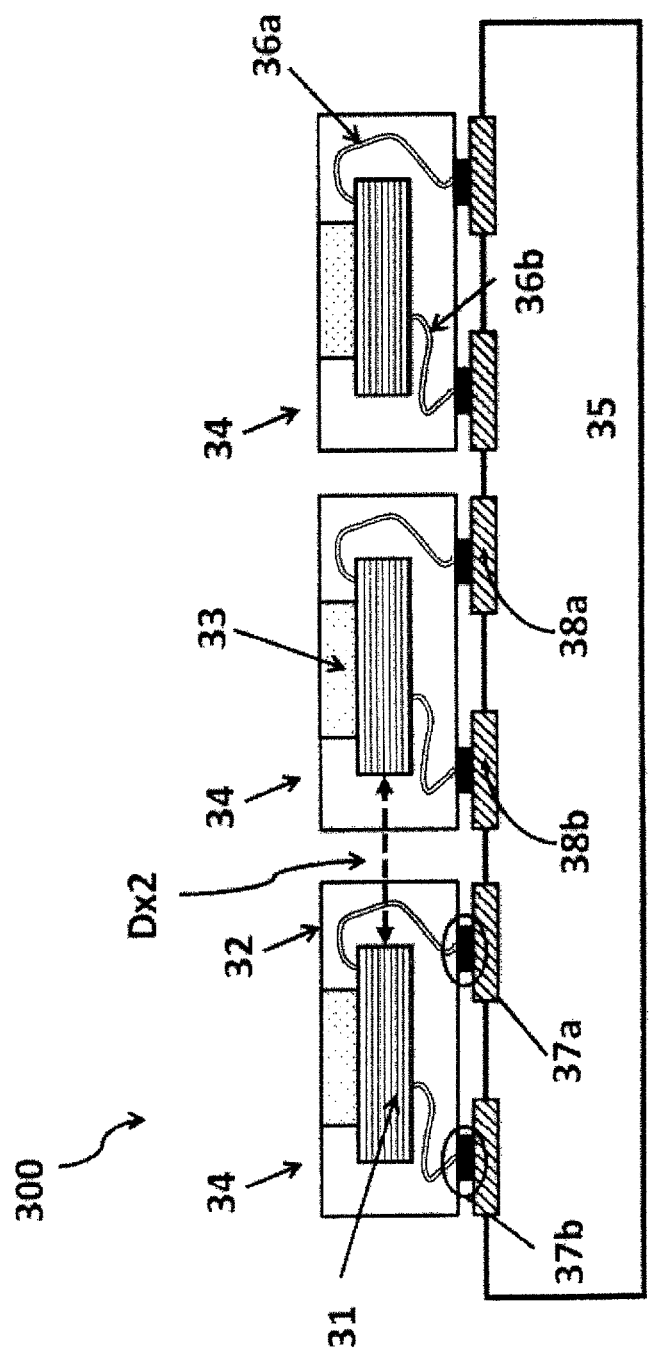

A non-monolithic SiPM array 300, as depicted in FIG. 4, uses packaged SiPM chips 31 in an optical package 32 (i.e. a package provided with a transparent front or a transparent front window 33). The packaged devices 34 are mounted on a printed circuit board or other support 35. The optical package has the function of mechanical protection and of connection of the electrical front contact of the die to a respective metal route 38a defined on the supporting board 35.

Another type of non-monolithic SiPM array uses bare SiPM dies instead of packaged SiPM chips in replicating the same array organization over the supporting board. According to the non-monolithic approaches of the prior art, allowance for bond wire connections of the front pads of the pixel dies to respective metal lines defined on the supporting board requires allocation of interspaces typically of several hundreds of micro-meters along the X and Y directions.

Use of through silicon vias (TSV) connections instead of bond wire connections of the front pad of the SiPM dies to respective pixel biasing and sensing would improve the array fill factor; however, the opening of TSVs through a silicon wafer require specific, non standard processing equipments and has well recognized criticalness, to the point of practical incompatibility for SiPM applications, because the additional process steps required for TSV formation creates mechanical stresses in the silicon crystal. Moreover, considering that a SiPM is intrinsically a "low pin number" device, use of such a complex and expensive processing technology appears economically unjustified.

To the above discussed inefficiencies, limitations, drawbacks and complexities of practiced known architectures and processes of solid state photomultipliers, and to the economical and mechanical incompatibilities of sophisticated TSV integration processing, the applicant has found a remedy in a surprisingly effective and comparably simpler architecture for a multi-pixel photo sensor for imaging applications employing solid state photomultipliers.

Contrary to the established practice in fabricating non monolithic multi-pixel arrays of SiPM dies, the applicant has found that a decisive improvement of the "fill factor" and a significant reduction of pixel cross-talk are achieved without any sensible penalization of dynamic response characteristics, by reversing which of the two electrical contacts of the individual SiPM dies is connected in common and which is individually connected to a respective pixel sensing pin of the multi-pixel array sensor. Such a reversion, practically unties the "fill factor" from the number of pixels, removing what has until now recognized as the most severe constraint to an unlimited increasing of the array size (number of pixels).

According to a first embodiment, a multi-pixel photo sensor for imaging applications of virtually unlimited size comprises an array of juxtaposed bare silicon photomultiplier chips (bare dies) that are individually and directly bonded onto the surface of a supporting multilevel printed circuit board (PCB) having a common (e.g. of negative or cathode bias) bus defined thereon, which may run all around the footprint of the multichip array or along at least part of its perimeter.

Front connection metal pads of the metal grid of connection are in common of all the individual series resistors of all the microcells of all the integrated SiPM bare silicon dies, and are interconnected in common by bond wires (connecting wire bridges) and thence to the metal bus surrounding the array for biasing the distinct front electrode regions (e.g. the cathodes of the integrated SPADs) of all the photomultiplier dies.

A metallization layer of the substrate (e.g. the contact of positive or anode bias) on the underside coupling surface of each die of the multi-chip photomultiplier array, individually connects, through connection metal pads defined within the coupling area of the supporting PCB and respective electrical connection pathways, pre-defined in the multilevel PCB, to bias and sense pins of the individual pixel bare SiPMs of the multi-chip array. A transparent plastic layer formed over the whole active front side of the die array encapsulates the front wiring of the finished device.

Innumerable alternative layout arrangements of the front side interconnection metal pad or pads of the closely juxtaposed bare dies may be implemented for connecting in common all the individual series resistors of all the SPAD microcells of all the integrated SiPM bare silicon dies to the metal bus running close to the perimeter of the bare chip array. Whichever the arrangement chosen, interconnections of the front pads, i.e. conductors bridging juxtaposed ends of metal pads belonging to closely juxtaposed adjacent dies, normally implemented with common wire bonding techniques, have a negligible impact on the accounting of blind area subtracted to the full active front side areas of the bare dies, while the fill factor of the imaging photo sensor is greatly improved by the ability of closely juxtaposing the bare semiconductor dies one close to another with a small as possible separation gap, such to be practically negligible as far as blind area of the composite photonic sensor is concerned.

Figure 5:
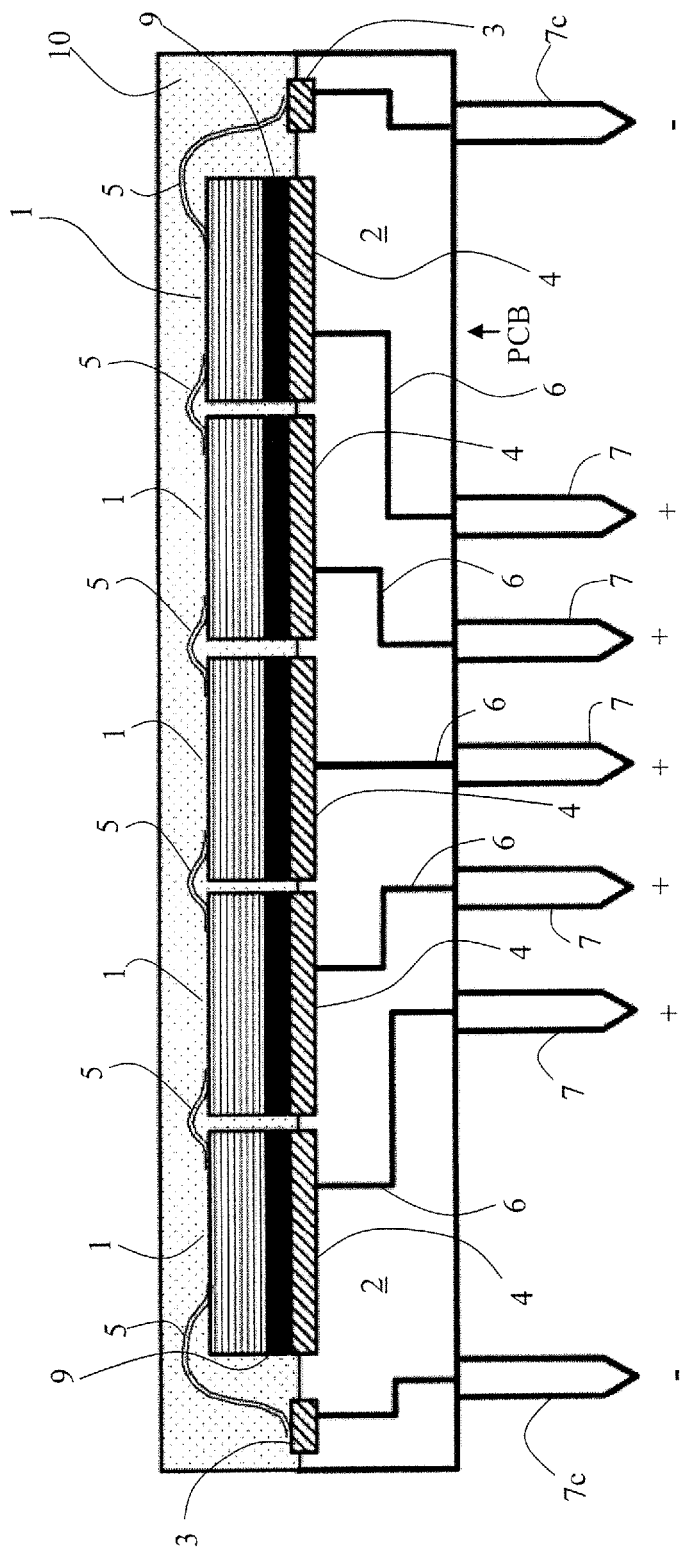
FIGS. 5 and 6 are exemplary cross-sectional and front side views of an embodiment of non-monolithic multi-pixel imaging sensor array of bare SiPMs dies, according to the present disclosure.
Figure 6:
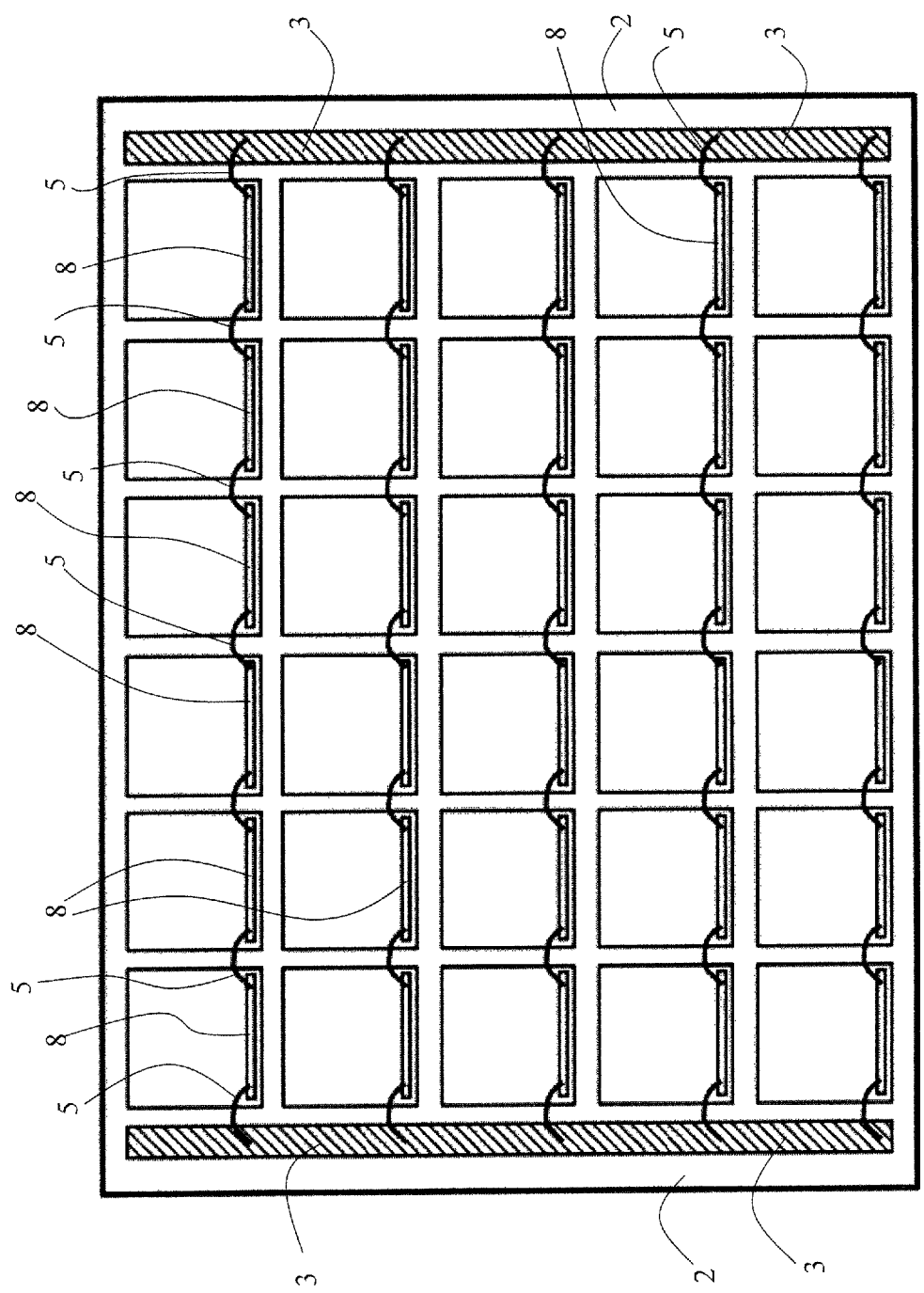

An exemplary embodiment of the architecture of this disclosure for a multi-pixel photo sensor for imaging applications of virtually unlimited size is illustrated in FIGS. 5 and 6. This array is organized in rows and columns, of side-by-side juxtaposed bare semiconductor dies 1 of monolithically integrated SiPMs, often referred to in this disclosure also with the alternative expressions of bare semiconductor dies or, briefly, bare dies.

The array comprises a supporting multilevel metal, printed circuit board 2 (briefly PCB). A metal bus 3 is defined onto the front surface of the supporting PCB 2. The metal bus 3 may run all around the footprint area of the multichip array i.e. around a dedicated area of the surface of the supporting PCB 2 or along at least part of its perimeter and may even be composed of two or more tracts of patterned surface metal layer of the PCB. In the example shown, two metal tracts 3 extend along opposite sides of the rectangular 6×5 array of bare silicon photomultiplier chips 1.

Front side metal pads are defined together with the metal lines of micrometric width (corresponding to the metal lines 23 of FIG. 2) that form the grid that connect in common to the connection pad all the series resistors (corresponding to the polysilicon part 22 of FIG. 2) of the individual SPADs of each single SiPM die. In the layout view of FIG. 6, the metal lines (23 of FIG. 2) of micrometrical width that constitute the interconnection grid of the integrated microcells are omitted for drawing clarity. The distinctly visible front pads are, in this example, narrow strips 8 extending, as shown, short of reaching opposite edges of the die 1.

Short bond wires 5 connect the juxtaposed end of the narrow metal strips 8 of adjacent SiPM dies 1, bridging across a practically minimized distance of separation among the juxtaposed mounted dies and finally to the metal bus 3 on the board 2, for negatively biasing in common the cathodes of all the integrated microcell SPADs of every SiPM die of the multi-pixel array. Electrical connection pathways 6, pre-defined in the metals of the supporting multilevel PCB 2, connect the metal bus 3 to one or more preferably to a redundant number of pins 7c, spaced along the length of the metal bus for a more uniform distribution of the bias current to all the integrated SPADs. Each defined metal island 4 is under the assembly footprint of each bare SiPM die of the array to a respective pin 7 of positive bias and of pixel sensing of the multi-pixel photo sensor for imaging applications.

Each bare SiPM die 1 may have a bottom side metallization layer 9 in electrical contact with the semiconductor substrate constituting the common anode contact of the integrated SiPM (i.e. the pixel sensing contact of the multi-pixel photo sensor for imaging applications).

Upon mounting the bare SiPM dies of the array, their bottom metallization layer 9 is bonded in electrical contact with respective metal pads 4 defined on the front side area of the board 2, onto which is assembled the multi-pixel imaging sensor, by a solder layer or by a conductive structural adhesive, thus connecting each array pixel to a respective pin 7 of positive bias and pixel sensing.

All the bias and sense pins 7c, 7, of the array may be organized along the perimeter of the PCB 2 that may be just sufficiently larger than the perimeter of the area of assembly of the planar array of side-by-side juxtaposed bare semiconductor dies 1 of the multi-pixel photo sensor for imaging applications. This is practically without detracting any substantial amount of active area among the SiPMs dies 1 mounted on the supporting PCB 2, in close juxtaposition with practically negligible gap spaces among them.

A transparent layer 10 of passivation and mechanical protection may be formed from a voids filling precursor plastic gel deposited over the whole active front side of the composite "tile" sensor for encapsulating the whole front of the finished device with the multiplicity of bridging bond wires 5 among the front surface grid contact pads 8 of the juxtaposed bare chips 1. These are innumerable ways of interconnecting in common and to the bias bus 3 defined onto the front surface of the supporting PCB 2 (re: FIG. 5 and FIG. 6) the front side electrodes of all the integrated SPADs of all the SiPM dies 1, through very slender surface pads 8 of the interconnecting front surface metal grid, as will immediately realized by the expert reader.

A way particularly effective for large arrays, is to define, in lieu of a straight line connection pad 8, a cross-shaped metal pad centered on the front surface of each die, the slender arms of which divide in four equal parts (either triangular or square parts) by extending toward the four corners or toward the four sides of the perimeter of the typically square front surface of the SiPM dies. Juxtaposed ends of the slender arms of the cross-shaped pad of adjacent dies may then be connected by short bond wire bridges for connecting in common the surface pads of the many dies and finally to the bias distribution bus 3 defined onto the front surface of the supporting PCB 2. Alternatively, each die 1 may have four connection metal pads 8 defined in proximity of the four corners of the interconnection grid of all the front electrodes of the integrated SPAD microcells of the die and each pad may have bond wire connections to the juxtaposed corner pads 8 of adjacent dies 1 and/or to the metal bus 3 of bias distribution.

Figure 7:
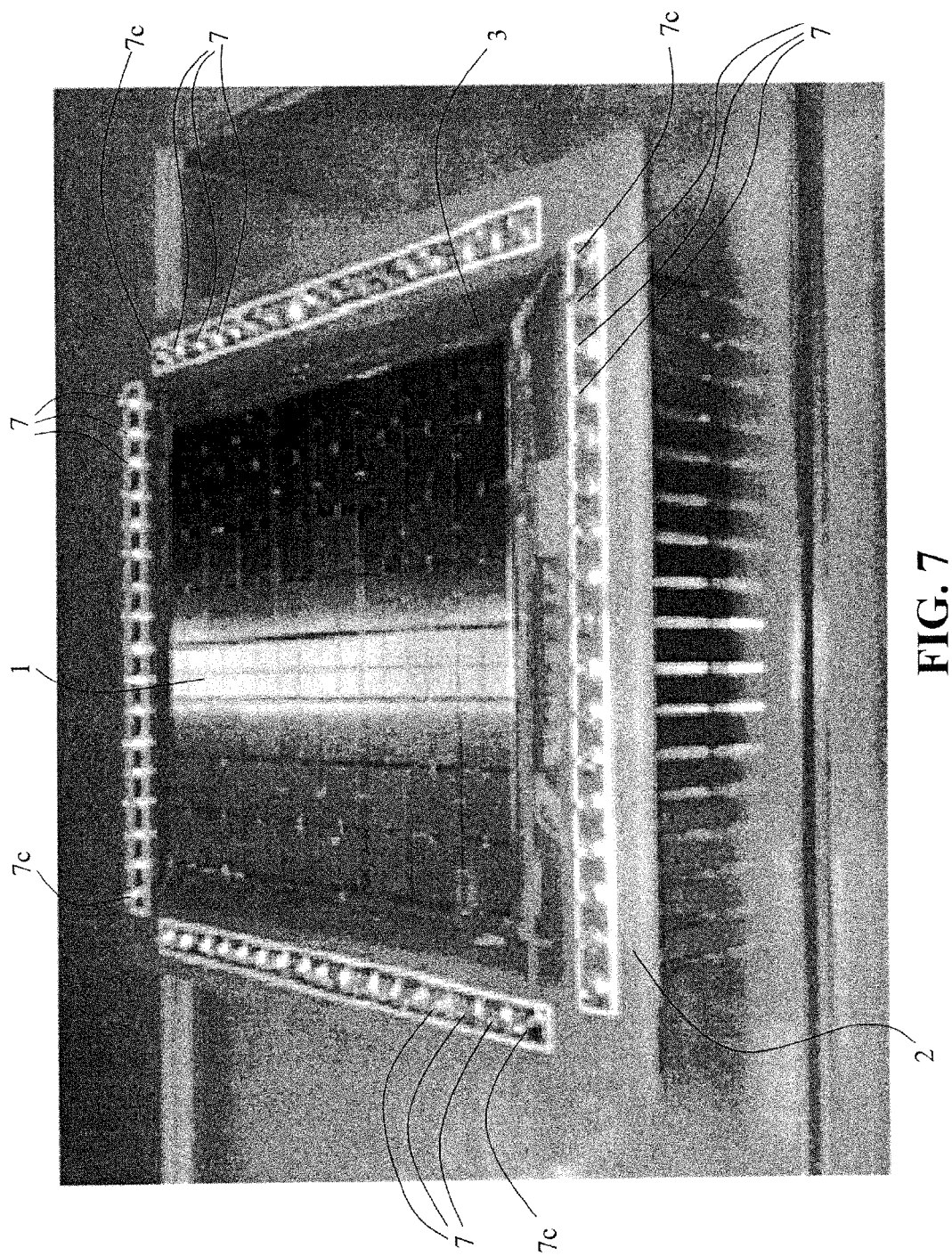
FIG. 7 is a photograph of an 8×8 array of a prototype multi-pixel imaging sensor, according to the present disclosure.

FIG. 7 is a photograph of a completed 8×8 array of a prototype multi-pixel photo sensor tile T for imaging applications, with centered cross-shaped metal pads on the front surface of each SiPM die 1. The slender arms are visible in the light reflecting areas while the bond wire bridges are more faintly visible in the non reflecting portions of the illuminated 8×8 array. The anode pins 7 of the 64 SiPMs are organized through the multilevel supporting PCB 1, along the four sides of the multichip array, 16 pins on every side. The common cathode bias metal bus 3 connects to four (redundant) corner pins 7c, for more equally biasing all the SiPMs of the tile.

Figure 8:
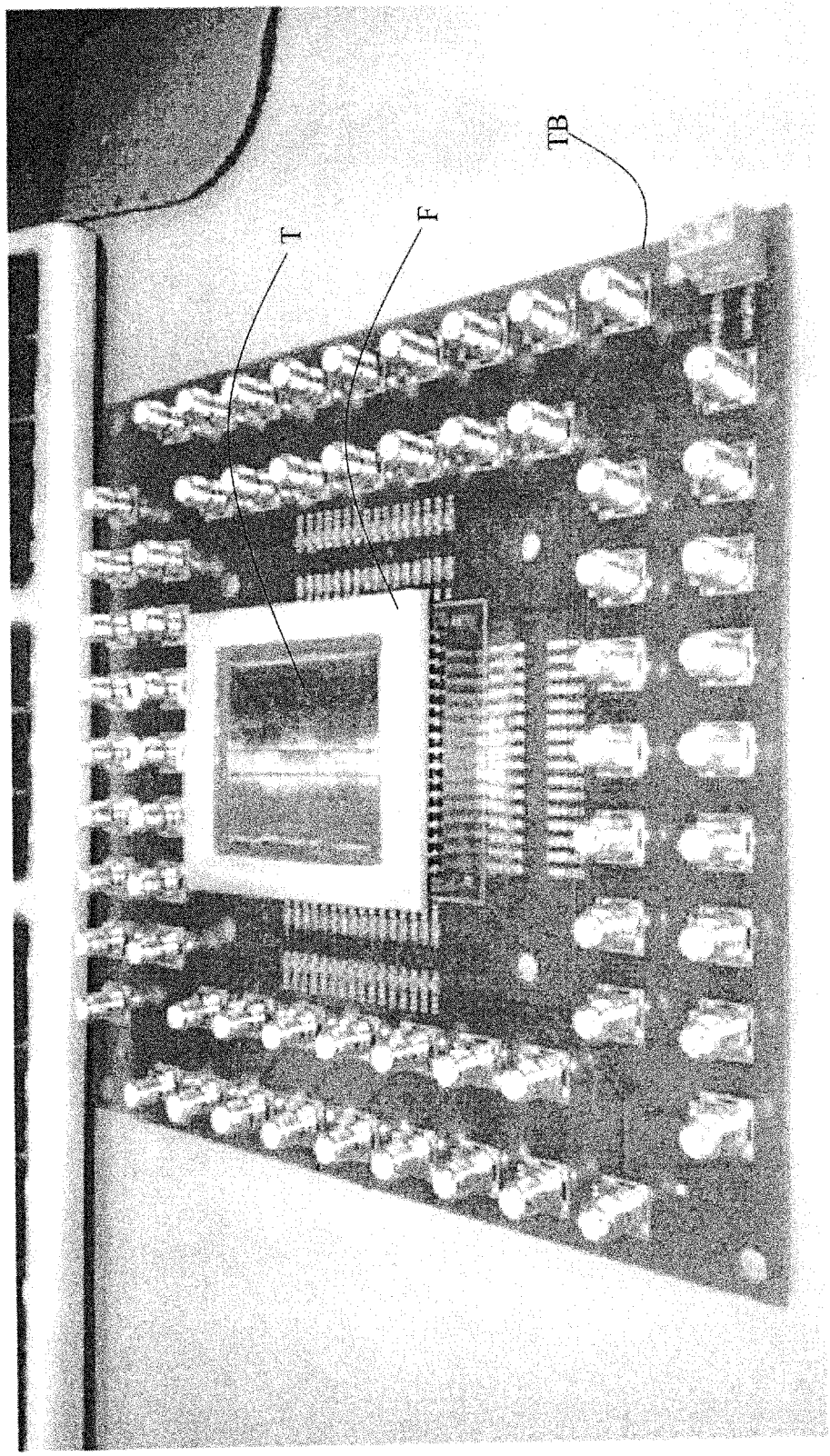
FIG. 8 is a photograph of the 8×8 bare die array prototype after having been subjected to passivation with a transparent protection gel and mounted over a test mother board, according to the present disclosure.

FIG. 8 is a photograph of the 8×8 bare die array prototype tile T, mounted over a test board TB, for characterization. The tile T had been subjected to passivation with a transparent gel and the top frame F employed for defining the passivation gel had yet to be lifted off after completion of the hardening of the transparent gel coat.

Besides untying the number of pixels and rectangular shape from blind area ratio of the multi-pixel photo sensor array for imaging applications, definition of slender front side connection metal pads for proper bias distribution over the sensing bare die surface and precise juxtaposition of the connection metal pad ends of adjacent array pixel dies, allow an extreme shortness of bond wire bridges among co-planar wire bonding pads of all the array pixel dies. This coupled to an appropriate design of the electrical paths of pixel connection to the peripheral arrays of pixel sensing pins through the multilevel supporting PCB, reduces cross-talk among adjacent array pixels and improves response dynamics.

That which is claimed is:

1. A multi-pixel photomultiplier optical sensor comprising:
   a multilevel printed circuit board;
   a plurality of electrically conductive traces carried by said multilevel printed circuit board;
   a plurality of electrically conductive pads carried by said multilevel printed circuit board;
   an electrically conductive bus carried by said multilevel printed circuit board;
   a plurality of electrically conductive pins carried by said multilevel printed circuit board and comprising a first group along a perimeter of said multilevel printed circuit board, and a second group on a surface of the multilevel printed circuit board;
   each electrically conductive pin from said first group being coupled via said plurality of electrically conductive traces to said electrically conductive bus;
   each electrically conductive pin from said second group being coupled via said plurality of electrically conductive traces to a respective electrically conductive pad;

an array of monolithic silicon photomultiplier (SiPM) dies, each monolithic SiPM die having a front side and a rear side;

each monolithic SiPM die comprising
a front side connection pad,
a plurality of single photon avalanche diode (SPAD) cells optically isolated from one another, each SPAD cell including
a front side electrode,
a rear side electrode, and
a resistor coupled in series to said front side electrode and coupled in common with all other resistors to said front side connection pad, and
a metallization layer in contact with said rear side electrode and the respective electrically conductive pad from said plurality thereof;

said array of monolithic SiPM dies being positioned side-by-side;
said electrically conductive bus being coupled to at least one electrically conductive pin for uniformly distributing bias current to all of said array of monolithic SiPM dies; and
a plurality of electrically conductive bond wires coupling at least some of the plurality of electrically conductive pads to said electrically conductive bus, and distributing bias current to said array of monolithic SiPM dies via said electrically conductive bus.

2. The multi-pixel photomultiplier optical sensor of claim 1 wherein said front side connection pad of the array of monolithic SiPM dies extends along an edge portion of the front side; wherein said front side connection pad of the array of monolithic SiPM dies extends in at least one of a row wise and column wise direction; and wherein said plurality of electrically conductive bond wires couples said front side connection pad of the array of monolithic SiPM dies to said electrically conductive bus.

3. The multi-pixel photomultiplier optical sensor of claim 1 wherein said front side connection pad of the array of monolithic SiPM dies has a shape of a cross centered on each monolithic SiPM die; and further comprising additionally electrically conductive bond wires coupling ends of the cross to adjacent ones from adjacent monolithic SiPM dies.

4. The multi-pixel photomultiplier optical sensor of claim 1 wherein said front side connection pad comprises a plurality thereof adjacent respective corners of each monolithic SiPM die; and further comprising additionally electrically conductive bond wires coupling said some front side connection pads to adjacent ones from adjacent monolithic SiPM dies.

5. The multi-pixel photomultiplier optical sensor of claim 1 wherein said metallization layer is bonded in electrical contact with said plurality of electrically conductive pads with at least one of solder and electrically conductive structural adhesive.

6. The multi-pixel photomultiplier optical sensor of claim 1 further comprising a transparent coating embedding the array of monolithic SiPM dies, and said electrically conductive bus.

7. A multi-pixel photomultiplier optical sensor comprising:
a circuit board;
a plurality of electrically conductive traces carried by said circuit board;
a plurality of electrically conductive pads carried by said circuit board;
an electrically conductive bus carried by said circuit board;
a plurality of electrically conductive pins carried by said circuit board and comprising first and second groups;
each electrically conductive pin from said first group being coupled via said plurality of electrically conductive traces to said electrically conductive bus;
each electrically conductive pin from said second group being coupled via said plurality of electrically conductive traces to a respective electrically conductive pad;
an array of photomultiplier dies, each photomultiplier die comprising
a front side connection pad,
a plurality of single photon avalanche diode (SPAD) cells, each SPAD cell including
a front side electrode,
a rear side electrode, and
a resistor coupled in series to said front side electrode and coupled in common with other resistors to said front side connection pad, and
a metallization layer in contact with said rear side electrode and the respective electrically conductive pad from said plurality thereof;
said electrically conductive bus being coupled to at least one electrically conductive pin for distributing bias current to said array of photomultiplier dies; and
a plurality of electrically conductive bond wires coupling at least some of the plurality of electrically conductive pads to said electrically conductive bus, and distributing bias current to said array of photomultiplier dies via said electrically conductive bus.

8. The multi-pixel photomultiplier optical sensor of claim 7 wherein said front side connection pad of the array of photomultiplier dies extends along an edge portion of the front side; wherein said front side connection pad of the array of photomultiplier dies extends in at least one of a row wise and column wise direction; and wherein said plurality of electrically conductive bond wires couples said front side connection pad of the array of photomultiplier dies to said electrically conductive bus.

9. The multi-pixel photomultiplier optical sensor of claim 7 wherein said front side connection pad of the array of photomultiplier dies has a shape of a cross centered on each photomultiplier die; and further comprising additionally electrically conductive bond wires coupling ends of the cross to adjacent ones from adjacent photomultiplier dies.

10. The multi-pixel photomultiplier optical sensor of claim 7 wherein said front side connection pad comprises a plurality thereof adjacent respective corners of each photomultiplier die; and further comprising additionally electrically conductive bond wires coupling said some front side connection pads to adjacent ones from adjacent photomultiplier dies.

11. The multi-pixel photomultiplier optical sensor of claim 7 wherein said metallization layer is bonded in electrical contact with said plurality of electrically conductive pads with at least one of solder and electrically conductive structural adhesive.

12. The multi-pixel photomultiplier optical sensor of claim 7 further comprising a transparent coating embedding the array of photomultiplier dies, and said electrically conductive bus.

13. A method for making a multi-pixel photomultiplier optical sensor comprising:
forming a plurality of electrically conductive traces carried by the circuit board;
forming a plurality of electrically conductive pads carried by the circuit board;

forming an electrically conductive bus carried by the circuit board;

forming a plurality of electrically conductive pins carried by the circuit board and comprising first and second groups;

each electrically conductive pin from the first group being coupled via the plurality of electrically conductive traces to the electrically conductive bus;

each electrically conductive pin from the second group being coupled via the plurality of electrically conductive traces to a respective electrically conductive pad;

positioning an array of photomultiplier dies, each photomultiplier die comprising
- a front side connection pad,
- a plurality of single photon avalanche diode (SPAD) cells, each SPAD cell including
  - a front side electrode,
  - a rear side electrode, and
  - a resistor coupled in series to the front side electrode and coupled in common with other resistors to the front side connection pad, and
- a metallization layer in contact with the rear side electrode and the respective electrically conductive pad from the plurality thereof;

the electrically conductive bus being coupled to at least one electrically conductive pin for distributing bias current to the array of photomultiplier dies; and forming a plurality of electrically conductive bond wires coupling at least some of the plurality of electrically conductive pads to the electrically conductive bus, and distributing bias current to the array of photomultiplier dies via the electrically conductive bus.

14. The method of claim 13 wherein the front side connection pad of the array of photomultiplier dies extends along an edge portion of the front side; wherein the front side connection pad of the array of photomultiplier dies extends in at least one of a row wise and column wise direction; and wherein the plurality of electrically conductive bond wires couples the front side connection pad of the array of photomultiplier dies to the electrically conductive bus.

15. The method of claim 13 wherein the front side connection pad of the array of photomultiplier dies has a shape of a cross centered on each photomultiplier die; and further comprising forming additionally electrically conductive bond wires coupling ends of the cross to adjacent ones from adjacent photomultiplier dies.

16. The method of claim 13 wherein the front side connection pad comprises a plurality thereof adjacent respective corners of each photomultiplier die; and further comprising forming additionally electrically conductive bond wires coupling the some front side connection pads to adjacent ones from adjacent photomultiplier dies.

17. The method of claim 13 wherein the metallization layer is bonded in electrical contact with the plurality of electrically conductive pads with at least one of solder and electrically conductive structural adhesive.

18. The method of claim 13 further comprising forming a transparent coating embedding the array of photomultiplier dies, and the electrically conductive bus.

* * * * *